US011959961B2

(12) United States Patent
Barnett

(10) Patent No.: US 11,959,961 B2
(45) Date of Patent: Apr. 16, 2024

(54) METHOD OF DETERMINING AN X AND Y LOCATION OF A SURFACE PARTICLE

(71) Applicant: Orbotech Ltd., Yavne (IL)

(72) Inventor: Robert Barnett, San Jose, CA (US)

(73) Assignee: Orbotech Ltd., Yavne (IL)

( * ) Notice: Subject to any disclaimer, the term of this patent is extended or adjusted under 35 U.S.C. 154(b) by 203 days.

(21) Appl. No.: 17/716,764

(22) Filed: Apr. 8, 2022

(65) Prior Publication Data

US 2023/0324454 A1 Oct. 12, 2023

(51) Int. Cl.
| G01N 21/88 | (2006.01) |
| B08B 5/02 | (2006.01) |
| B08B 13/00 | (2006.01) |
| G01B 11/00 | (2006.01) |
| G01R 31/28 | (2006.01) |
| G01R 31/308 | (2006.01) |

(52) U.S. Cl.
CPC ............ G01R 31/2881 (2013.01); B08B 5/02 (2013.01); B08B 13/00 (2013.01); G01B 11/002 (2013.01); G01R 31/308 (2013.01)

(58) Field of Classification Search
CPC .... G01N 21/896; G01N 21/94; G01B 11/002; B08B 5/02
See application file for complete search history.

(56) References Cited

U.S. PATENT DOCUMENTS

| 6,122,065 A * | 9/2000 | Gauthier | G01N 33/46 |
| | | | 356/394 |
| 6,437,357 B1 * | 8/2002 | Weiss | G01N 21/896 |
| | | | 250/559.46 |
| 6,833,554 B2 | 12/2004 | Wooh | |
| 7,359,068 B2 | 4/2008 | Yonescu | |
| 7,384,806 B2 | 6/2008 | Worster et al. | |
| 7,987,072 B2 | 7/2011 | Teshima et al. | |

(Continued)

FOREIGN PATENT DOCUMENTS

| CN | 107860311 | 3/2018 |
| CN | 109935531 | 6/2019 |

(Continued)

OTHER PUBLICATIONS

Asgari, "Laser Triangulation Provides Essential Metrology and Defect Inspection for Microbumps in 3DIC Manufacturing," International Wafer-Level Packaging Conference, Oct. 2011.

Primary Examiner — Alesa Allgood
(74) Attorney, Agent, or Firm — Hodgson Russ LLP

(57) ABSTRACT

A system including a modulator, a laser source, a mirror, a laser sensor, and a processor. The modulator is movable in a first direction. The laser source is configured to emit laser light in a direction parallel to the surface of the modulator. The mirror is configured to redirect the laser light. The laser sensor is configured to detect a first change in intensity when a particle on the surface of the modulator passes through the laser light emitted by the laser source. The laser sensor is further configured to detect a second change in intensity when the particle on the surface of the modulator passes through the laser light redirected by the at least one mirror. The processor is configured to determine an X-Y location of the particle based on the first change in intensity and the second change in intensity.

20 Claims, 11 Drawing Sheets

(56) References Cited

U.S. PATENT DOCUMENTS

| | | | |
|---|---|---|---|
| 8,195,011 B2 | 6/2012 | Goldring et al. | |
| 8,363,229 B2 | 1/2013 | Ben-Levi | |
| 8,804,110 B2 | 8/2014 | Urano et al. | |
| 8,922,764 B2 | 12/2014 | Urano et al. | |
| 10,613,445 B2 | 4/2020 | Hauptmann et al. | |
| 10,688,599 B2 | 6/2020 | Liu et al. | |
| 2005/0048741 A1 | 3/2005 | Phan et al. | |
| 2006/0109456 A1* | 5/2006 | Chou | G01N 21/47 356/237.3 |
| 2012/0008132 A1* | 1/2012 | Saito | G01N 21/9501 356/72 |
| 2020/0357704 A1 | 11/2020 | Schaefer | |

FOREIGN PATENT DOCUMENTS

| | | |
|---|---|---|
| CN | 106908945 | 10/2019 |
| CN | 114966361 A | 8/2022 |
| DE | 102014108136 | 12/2015 |
| EP | 0917649 | 1/2005 |
| JP | H0712558 | 1/1995 |
| JP | 3020280 | 3/2000 |
| JP | 2003065728 | 3/2003 |
| JP | 4001862 | 10/2007 |

\* cited by examiner

METHOD OF DETERMINING AN X AND Y LOCATION OF A SURFACE PARTICLE

FIELD OF THE DISCLOSURE

This disclosure relates to inspection processes and, more particularly, to a detection processes for surface particles on inspection tools.

BACKGROUND OF THE DISCLOSURE

An exemplary inspection process uses a modulator to detect defects in electrical circuits on a glass panel. For example, the modulator may be movable over a portion of the glass panel, and lowered within tens of microns of the glass panel surface. When a drive signal is applied to electrodes of the glass panel, the electric field from the glass panel creates a temporarily visible display on the modulator, which can be captured by a camera to inspect defects. However, as the glass panel and the modulator are positioned adjacent to one another during inspection, foreign substances (e.g., particles) that may be present between the glass panel and the modulator may cause damage during the inspection operation. Particles may also reduce the accuracy of inspection processes.

At present, methods of cleaning the modulator are open-ended, meaning that the modulator surface may be periodically cleaned during the inspection process, but there is no confirmation that foreign substances have been removed from the modulator. Furthermore, existing methods for detecting foreign substances on the surface of the modulator are unable to locate the particles to confirm their removal or diagnose issues in the system.

Therefore, what is needed is a method for determining the X and Y location of a surface particle.

BRIEF SUMMARY OF THE DISCLOSURE

An embodiment of the present disclosure provides a system comprising a modulator, a laser source, at least one mirror, a laser sensor, and a processor. The modulator may be configured to detect defects in electrical circuits. The modulator may be movable in a first direction. The modulator may be movable at a constant speed. The laser source may be positioned adjacent to a first side of the modulator. The laser source may be configured to emit laser light toward a second side of the modulator in a direction parallel to the surface of the modulator and at a first angle relative to the first direction. The laser light may partially overlap the surface of the modulator. The at least one mirror may be positioned adjacent to the second side of the modulator opposite the first side. The at least one mirror may be configured to redirect the laser light toward the first side of the modulator at a second angle relative to the first direction. The laser sensor may be positioned adjacent to the first side of the modulator. The laser sensor may be configured to detect a first change in intensity of the laser light received from the laser source when a particle on the surface of the modulator passes through the laser light emitted by the laser source, and a second change in intensity in the laser light received from the laser source redirected by the at least one mirror when the particle on the surface of the modulator passes through the laser light redirected by the at least one mirror. The processor may be configured to determine an X-Y location of the particle based on the first change in intensity and the second change in intensity.

According to an embodiment of the present disclosure, the system may further comprise an air knife configured to remove the particle from the surface of the modulator after the X-Y location of the particle is determined. The air knife may be positioned between the laser source and the laser sensor, or may be positioned downstream from the laser source and the laser sensor.

According to an embodiment of the present disclosure, the at least one mirror may comprise a pair of mirrors positioned at symmetrical angles relative to the first direction.

According to an embodiment of the present disclosure, the at least one mirror may comprise one mirror positioned parallel to the first direction.

According to an embodiment of the present disclosure, the X-Y location of the particle may be determined relative to an origin defined by a corner of the modulator that first passes through the laser light emitted from the laser source.

According to an embodiment of the present disclosure, the X-Y location of the particle may be determined based on a first distance between the laser source and the origin determined at a time corresponding to the first change in intensity and a second distance between the laser sensor and the origin determined at a time corresponding to the second change in intensity.

According to an embodiment of the present disclosure, the X-Y location of the particle may be determined based on a difference between a time corresponding to the first change in intensity and a time corresponding to the second change in intensity.

According to an embodiment of the present disclosure, the X-Y location of the particle may be determined based on the first angle and/or the second angle. The first angle and the second angle may be between 0 degrees and 90 degrees.

Another embodiment of the present disclosure provides a method comprising: moving a modulator in a first direction, the modulator being configured to detect defects in electrical circuits; emitting, by a laser source positioned adjacent to a first side of the modulator, laser light toward a second side of the modulator in a direction parallel to the surface of the modulator and at a first angle relative to the first direction, and the laser light partially overlaps the surface of the modulator; redirecting, by at least one mirror positioned adjacent to the second side of the modulator opposite the first side, the laser light toward the first side of the modulator at a second angle relative to the first direction; detecting, by a laser sensor positioned adjacent to the first side of the modulator, a first change in intensity in the laser light received from the laser source when a particle on the surface of the modulator passes through the laser light emitted by the laser source; detecting, by the laser sensor, a second change in intensity in the laser light received from the laser source redirected by the at least one mirror when the particle on the surface of the modulator passes through the laser light redirected by the at least one mirror; and determining, by a processor, an X-Y location of the particle based on the first change in intensity and the second change in intensity.

According to an embodiment of the present disclosure, the method may further comprise passing the modulator through an air knife to remove the particle from the surface of the modulator. The air knife may be positioned between the laser source and the laser sensor, and the air knife may be configured to be off when moving the modulator in the first direction. The method may further comprise moving the modulator in a second direction, the second direction being opposite to the first direction. The air knife may be configured to be on when moving the modulator in the second direction.

According to an embodiment of the present disclosure, the air knife may be positioned downstream from the laser source and the laser sensor, and the air knife may be configured to be on when moving the modulator in the first direction.

According to an embodiment of the present disclosure, the method may further comprise defining a corner of the modulator that first passes through the laser light emitted from the laser source as an origin. The X-Y location of the particle may be determined relative to the origin.

According to an embodiment of the present disclosure, determining, by the processor, the X-Y location of the particle based on the first change in intensity and the second change in intensity may comprise: determining a first distance between the laser source and the origin at a time corresponding to the first change in intensity; determining a second distance between the laser sensor and the origin at a time corresponding to the second change in intensity; and determining the X-Y location of the particle based on the first distance and the second distance.

According to an embodiment of the present disclosure, determining, by the processor, the X-Y location of the particle based on the first change in intensity and the second change in intensity may comprise: determining a distance traveled by the modulator in the first direction between a time corresponding to the first change in intensity and a time corresponding to the second change in intensity; and determining the X-Y location of the particle based on the distance traveled by the modulator in the first direction between the time corresponding to the first change in intensity and the time corresponding to the second change in intensity.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

An embodiment of the present disclosure provides a system 100. FIGS. 1A-H show the system 100 in a first configuration, and FIGS. 2A-H and 3A-B show the system 100 in a second configuration. The first and second configurations of system 100 may be referred to interchangeably herein. The system 100 may be part of a system used to inspect electrical circuits, e.g., in glass display panels. Liquid crystal display (LCD) panels incorporate liquid crystals that exhibit electric-field dependent light modulating properties. They are used frequently to display images and other information in a variety of devices ranging from fax machines, laptop computer screens, to large screen, high-definition TVs. Active matrix LCD panels are complex layered structures consisting of several functional layers: a polarizing film; a TFT glass substrate incorporating thin-film transistors, storage capacitors, pixel electrodes and interconnect wiring; a color filter glass substrate incorporating a black matrix and a color filter array and a transparent common electrode; an orientation film made of polyimide; and the actual liquid crystal material incorporating plastic/glass spacers to maintain proper LCD cell thickness. The system 100 may be used to inspect other types of glass display panels (e.g., OLED, micro LED, etc.) or other types of electrical circuits disposed on a substrate.

Figure 1A:
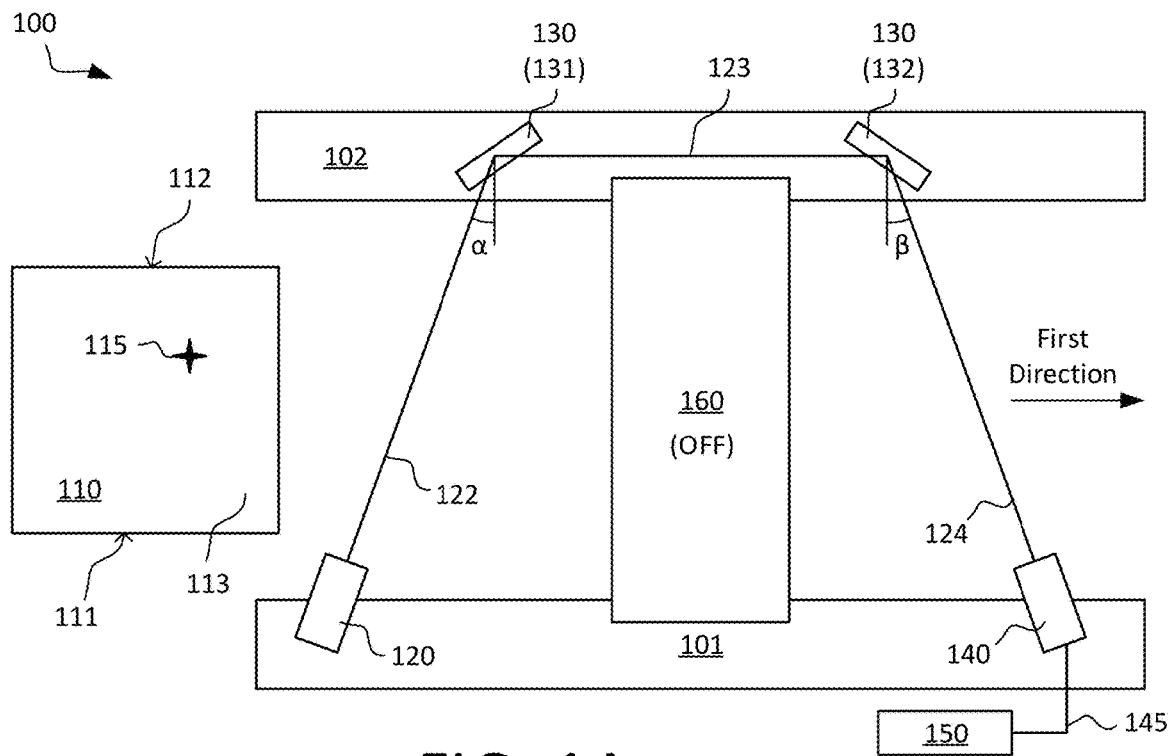
FIGS. 1A-F illustrate a modulator passing in a first direction through a system of the present disclosure in a first configuration.
Figure 2A:
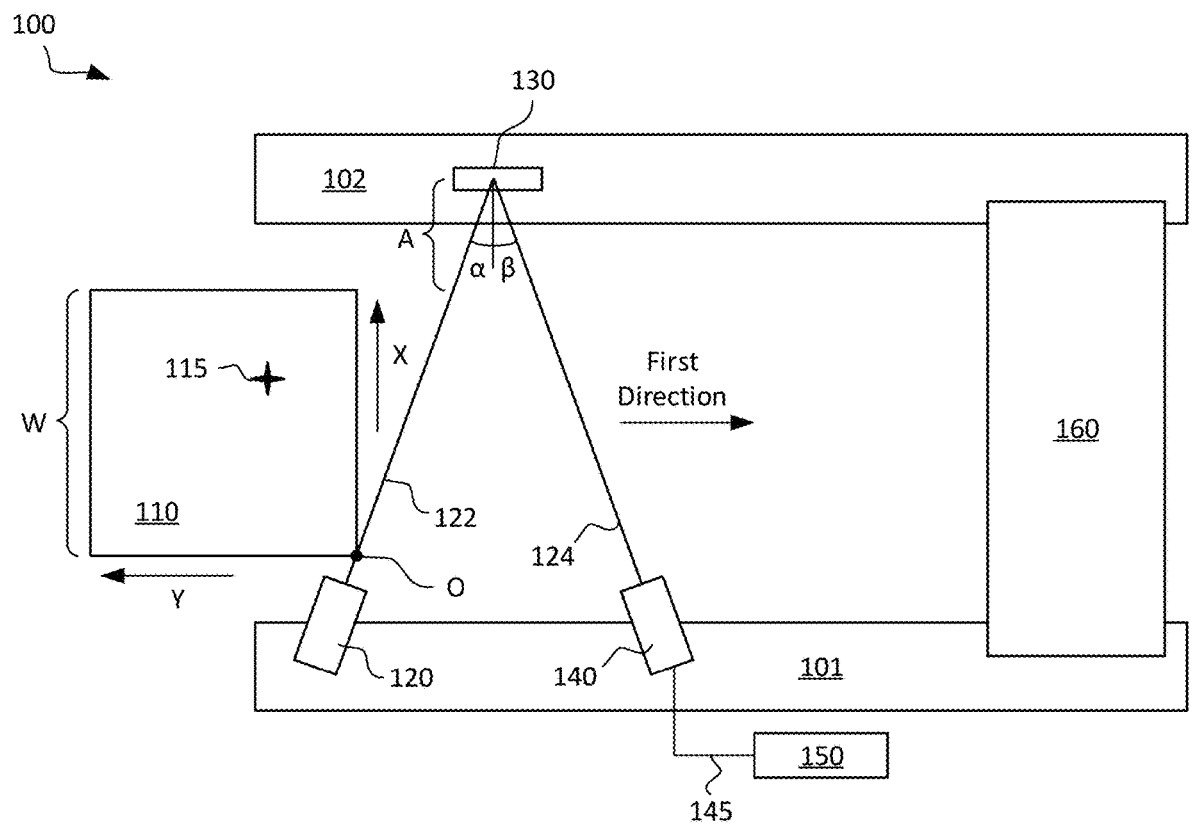
FIGS. 2A-H illustrate a modulator passing in a first direction through a system of the present disclosure in a second configuration and corresponding output signal graphs.
Figure 2B:

Referring to FIGS. 1A and 2A, the system 100 may comprise a modulator 110. The modulator 110 may be configured to detect defects in electrical circuits, e.g., in a glass panel. For example, the modulator 110 may be movable over a portion of the glass panel, and lowered within tens of microns of the glass panel surface. When a drive signal is applied to electrodes of the glass panel, the electric field from the glass panel may create a temporarily visible display on a surface 113 of the modulator 110, which can be captured by a camera to inspect defects. The modulator 110 may be movable in X, Y, and Z directions by a gantry (not shown). The gantry may be configured to move the modulator at a constant speed v. For example, the modulator 110 may be movable at a speed v of 1 m/s. Other speeds (either faster or slower) may be possible depending on system requirements. As further described herein, the modulator 110 may movable to perform a detection and cleaning process on the modulator 110. When performing the detection and cleaning process, the modulator 110 may be movable in a first direction. The first direction may correspond to −Y direction. The modulator 110 may be various sizes and shapes. For example, the modulator 110 may have a square shape, where each side is less than 200 mm. In a particular example, the modulator 110 may be 131 mm by 131 mm. Larger sizes of the modulator 110 (e.g., 500 mm) are possible. Other sizes and shapes of the modulator 110 are possible.

While the present disclosure is described with respect to a modulator 110, the system 100 may also be used for particle detection on wafers, which may be circular and between 100 mm and 300 mm in diameter, or on mother glass, which may be as large as 3 m by 3 m.

The system 100 may further comprise a laser source 120. The laser source 120 may be positioned adjacent to a first side 111 of the modulator 110. For example, the laser source 120 may be disposed on a first support structure 101 of the system 100. When performing the detection and cleaning process, the modulator 110 may move in the first direction such that the first side 111 of the modulator 110 is adjacent and parallel to the first support structure 101. The laser source 120 may be configured to emit laser light 122 toward a second side 112 of the modulator 110 in a direction parallel to the surface 113 of the modulator 110 and at a first angle α relative to the first direction. For example, the laser light 122 may be a circular spot laser, with a diameter of at least 100 μm, though other laser diameters are possible. In a particular embodiment, the laser diameter may be about 1 mm. The laser light 122 may be directed parallel across the surface of the modulator 110 and may at least partially overlap the surface 113 of the modulator 110. The laser light 122 may be directed at a converging or diverging angle across the surface of the modulator 110 so long as the laser light 122 at least partially overlaps the surface 113 of the modulator 110 along the entire path.

The first angle α may be 0 to 90 degrees. For example, the first angle α may be greater than 0 degrees and less than 90 degrees, and/or between 10 and 70 degrees. In a particular embodiment, the first angle α may be 20 degrees.

The system 100 may further comprise at least one mirror 130. The at least one mirror 130 may be positioned adjacent to the second side 112 of the modulator 110 opposite the first side 111. For example, the at least one mirror 130 may be disposed on a second support structure 102 of the system 100. When performing the detection and cleaning process, the modulator 110 may move in the first direction such that the second side 112 of the modulator 110 is adjacent and parallel to the second support structure 102. In this way, the modulator 110 may move in the first direction between the first support structure 101 and the second support structure 102 when performing the detection and cleaning process. The at least one mirror 130 may be configured to redirect the laser light 122 toward the first side 111 of the modulator 110 at a second angle β relative to the first direction. As used herein, the laser light 122 redirected by the least one mirror may be described as redirected laser light 124.

The second angle β may be 0 to 90 degrees. For example, the second angle β may be greater than 0 degrees and less than 90 degrees, and/or between 10 and 70 degrees. In a particular embodiment, the second angle β may be 20 degrees. The first angle α and the second angle β may be the same or different angles. While the first angle α and the second angle β are shown in the figures as angles relative to the vertical direction (i.e., X direction), it should be understood that some calculations may use complements of the first angle α and the second angle β (i.e., 90–α or 90–β) to use the angles relative to the horizontal direction (i.e., Y direction). In this way, the values of the first angle α and the second angle β may depend on the definition of the coordinate system of the system 100.

In the embodiment, the at least one mirror 130 may comprise a pair of mirrors. For example, the at least one mirror 130 may include a first mirror 131 and a second mirror 132, as shown in FIGS. 1A-H. The laser light 122 from the laser source 120 may be redirected from the first mirror 131 to the second mirror 132. The portion of the laser light redirected from the first mirror 131 and incident to the second mirror 132 may be referred to as intermediate laser light 123. The first mirror 131 and the second mirror 132 may be separated by a distance that is greater than or equal to the length of the modulator 110. In this way, the modulator 110 may completely pass through the laser light 122 before passing through the redirected laser light 124. Different distances may be used (e.g., smaller or larger) based on system requirements.

The first mirror 131 and the second mirror 132 may be positioned at symmetrical angles relative to the first direction. In this way, the first angle α of the laser light 122 incident to the first mirror 131 and the second angle β of the redirected laser light 124 from the second mirror 132 may be equal. For example, the first mirror 131 and the second mirror 132 may be positioned such that the intermediate laser light 123 is parallel to the first direction. In this way, a width between the first support structure 101 and the second support structure 102 may be minimized, and/or the intermediate laser light 123 may not pass across the surface 113 of the modulator 110. In other designs, the first mirror 131 and the second mirror 132 may be positioned at different angles relative to the first direction. In this way, the first angle α of the laser light 122 incident to the first mirror 131 and the second angle β of the redirected laser light 124 from the second mirror 132 may be different, and the intermediate laser light 123 may be angled relative to the first direction. Different angles for first angle α and the second angle β may be determined based on system requirements.

The at least one mirror 130 may comprise more than two mirrors, and may be disposed alternately on the first support structure 101 and the second support structure 102 to redirect the laser light 122 additional times.

In another embodiment, the at least one mirror 130 may comprise one mirror, as shown in FIGS. 2A-H and FIGS. 3A-B. The mirror 130 may be disposed on the second support structure 102. The mirror 130 may be positioned parallel to the first direction. In this way, the first angle α of the laser light 122 incident to the mirror 130 and the second angle β of the redirected laser light 124 may be equal. In this design, the mirror 130 may be simple to set up and align with the other components of the system 100. In other designs, the mirror 130 may be positioned at an angle relative to the first direction, such that first angle α and the second angle β may be different relative to the first direction. Different angles for first angle α and the second angle β may be determined based on system requirements. In either case, use of one mirror 130 may reduce space requirements compared to using more than one mirror 130.

The system 100 may further comprise a laser sensor 140. The laser sensor 140 may be positioned adjacent to the first side 111 of the modulator 110. For example, the laser sensor 140 may be disposed on the first support structure 101 of the system 110. The laser sensor 140 may be downstream of the laser source 120 in the first direction. The laser sensor 140 may produce an output signal 145 based on the laser light 122 received from the laser source 120. Graphs showing the output signal 145 are shown in FIGS. 2B, 2D, 2F, and 2H. A constant intensity in the output signal 145 produced by the laser sensor 140 may indicate that the surface 113 of the modulator is flat (e.g., free of defects or foreign substances). A change in intensity (i.e., a spike) in the output signal 145 produced by the laser sensor 140 may indicate a defect or foreign substance (e.g. particle 115) on the surface 113 of the modulator 110. The change in intensity may indicate a defect or foreign substance when greater than a preset threshold. The output signal 145 may be inverse to the measured power, meaning that a rising spike represents a short term interruption along the laser's path at that moment in time. Alternatively, the laser sensor 140 may be configured to produce the output signal 145 in a positive sense with appropriate changes to the system logic.

The particle 115 on the modulator 110 can cause damage when the modulator 110 is proximate a panel. These particles may be 20 μm to 30 μm in diameter or larger.

Figure 1B:
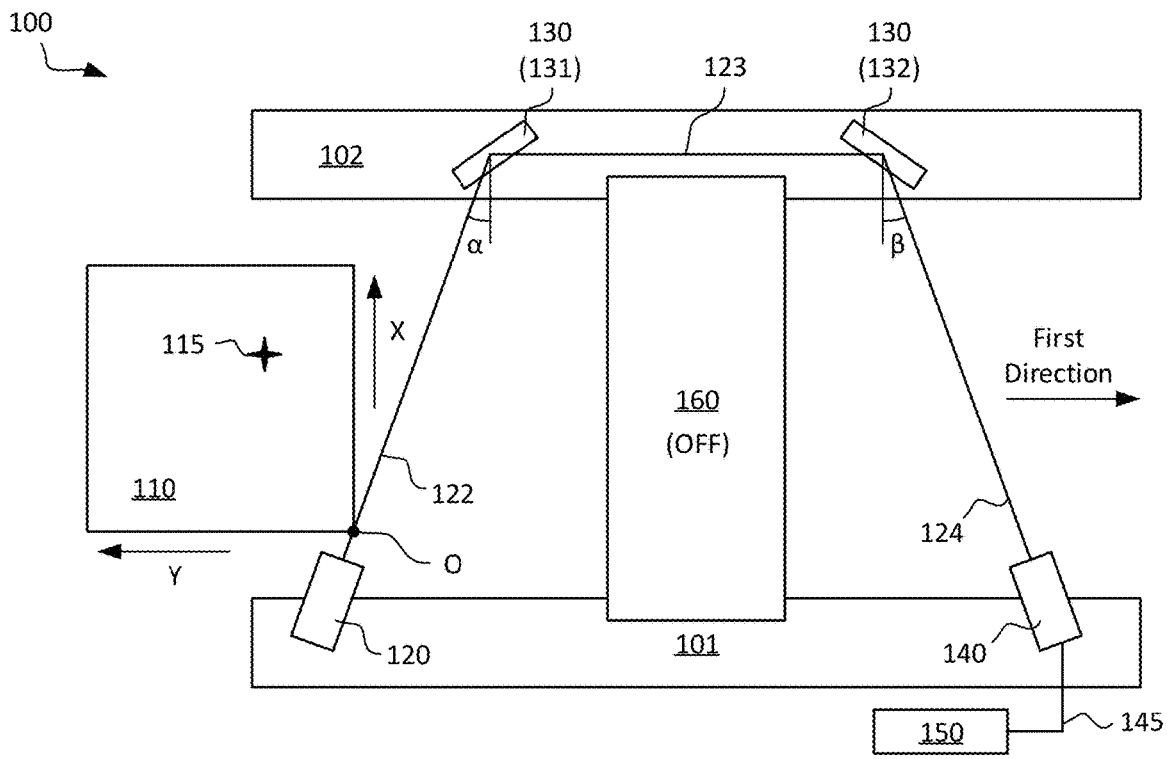
Figure 1C:
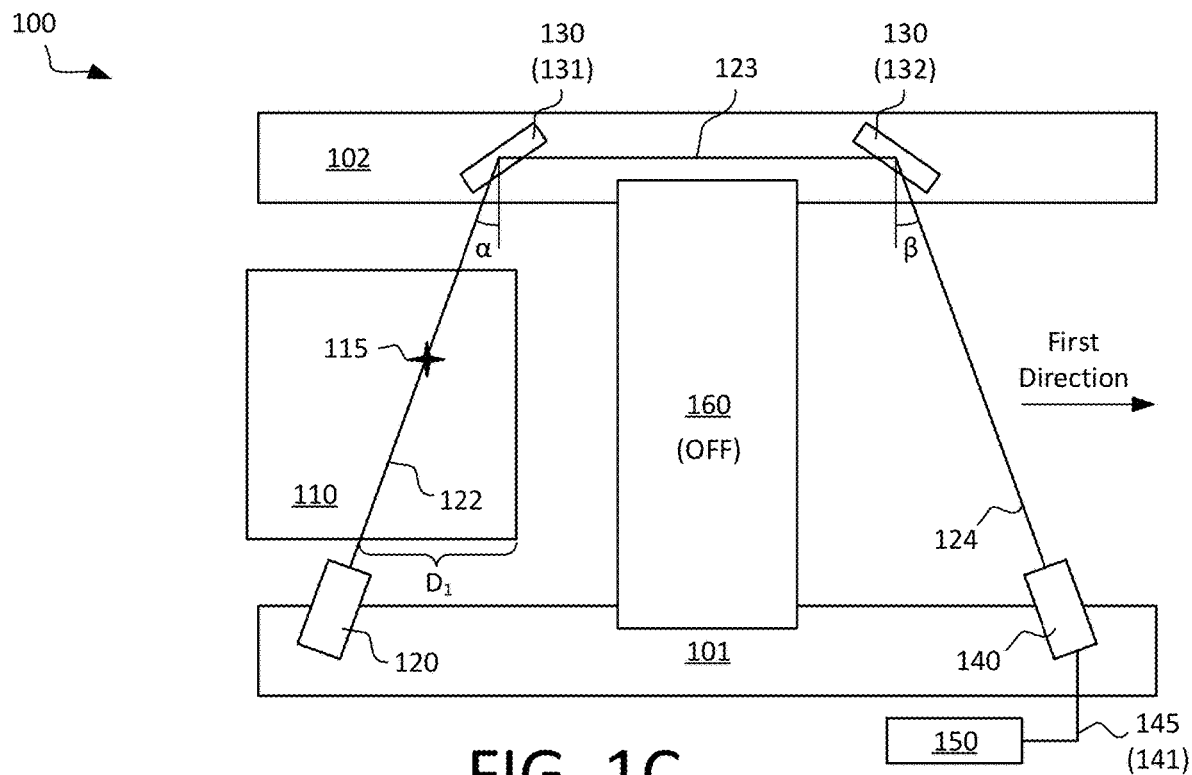
Figure 1D:
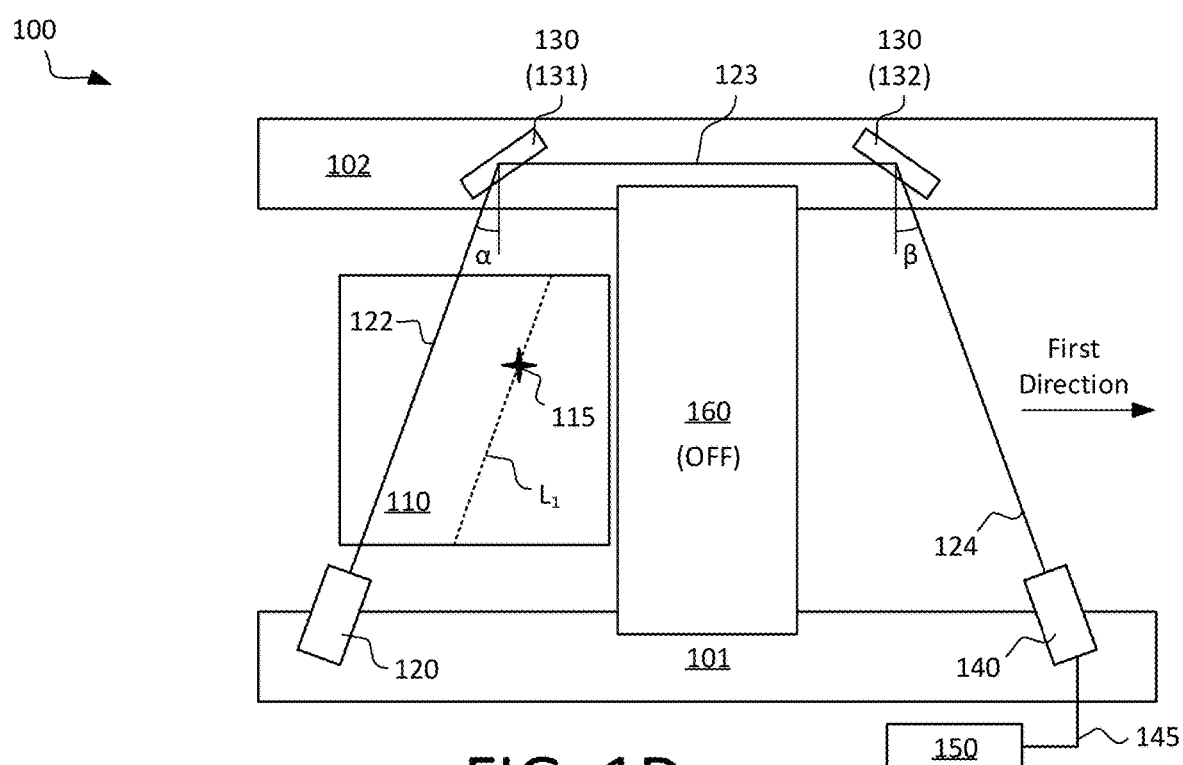
Figure 2C:
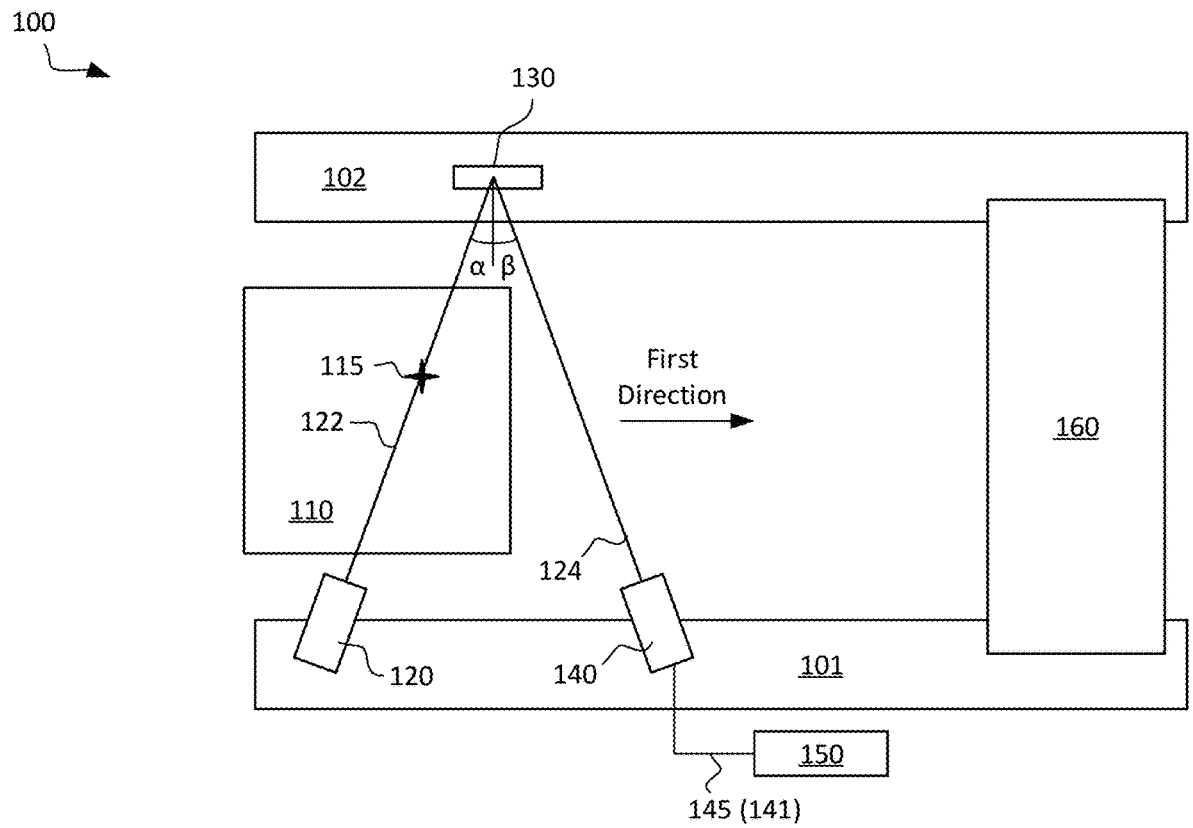
Figure 2D:
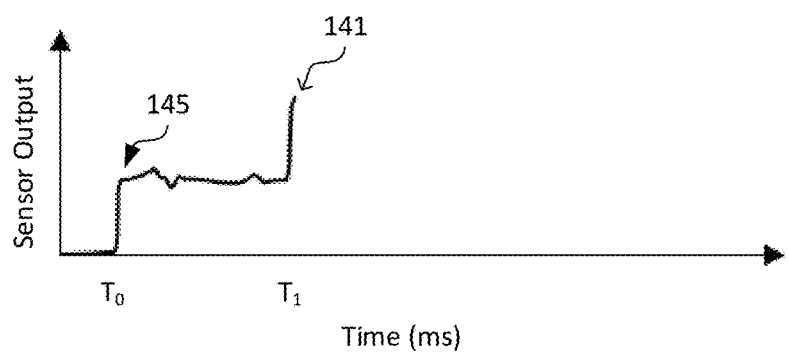

The laser sensor 140 may be configured to detect a first change in intensity 141 of the laser light 124 received from the laser source 120 when a particle 115 on the surface 113 of the modulator 110 passes through the laser light 122 emitted by the laser source 120 (as shown in FIGS. 1C, 2C, and 2D). In other words, when the modulator 110 moves in the first direction, the modulator 110 may pass through the laser light 122 emitted by the laser source 120. The particle 115 on the surface 113 of the modulator 110 may cause the first change in intensity 141 in the output signal 145.

Figure 1E:
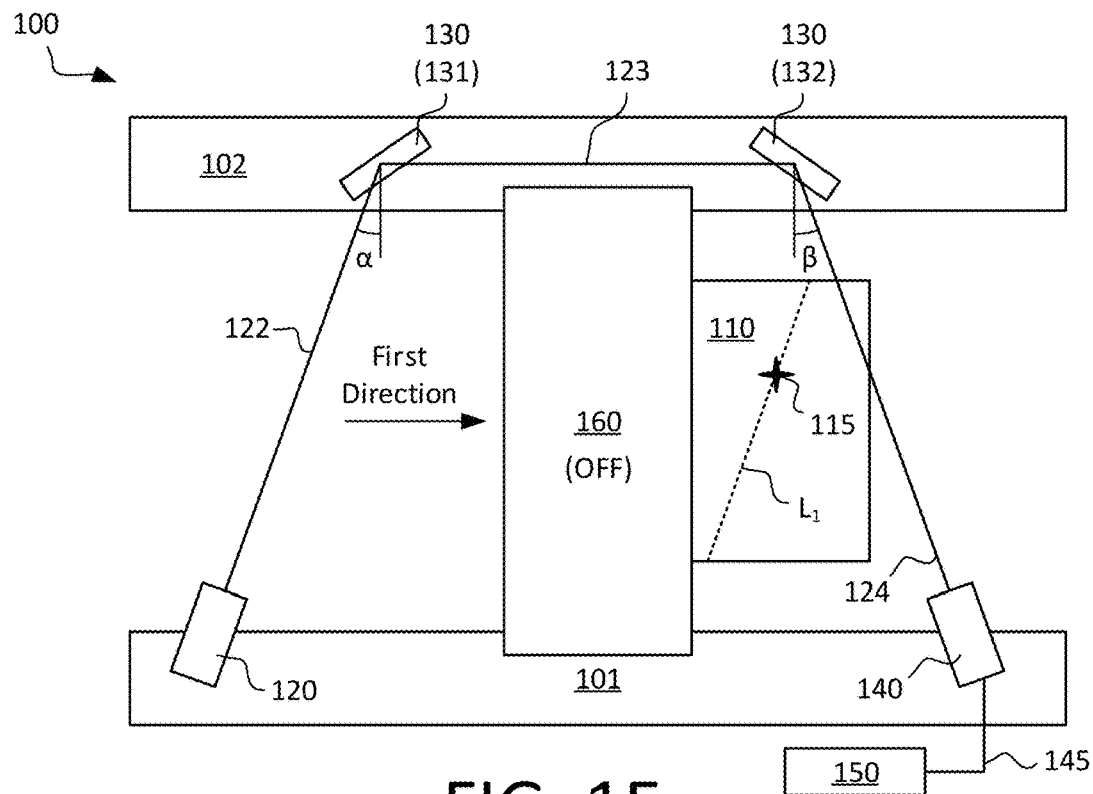
Figure 1F:
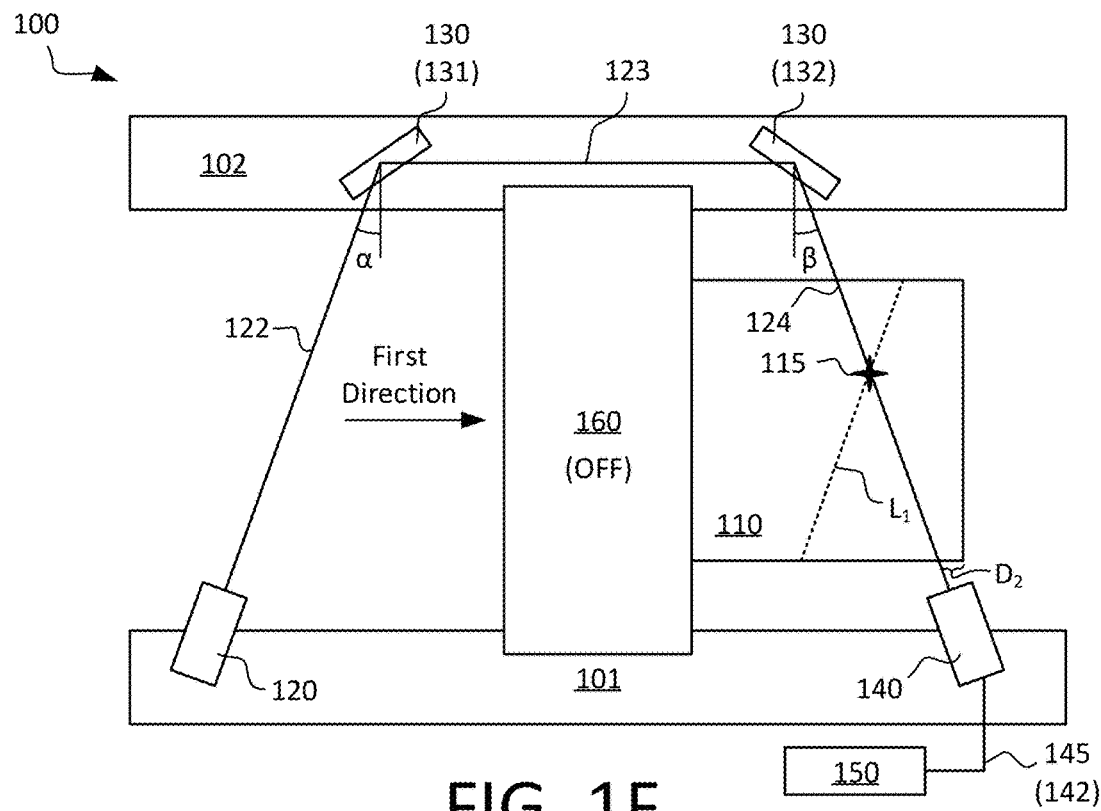
Figure 2E:
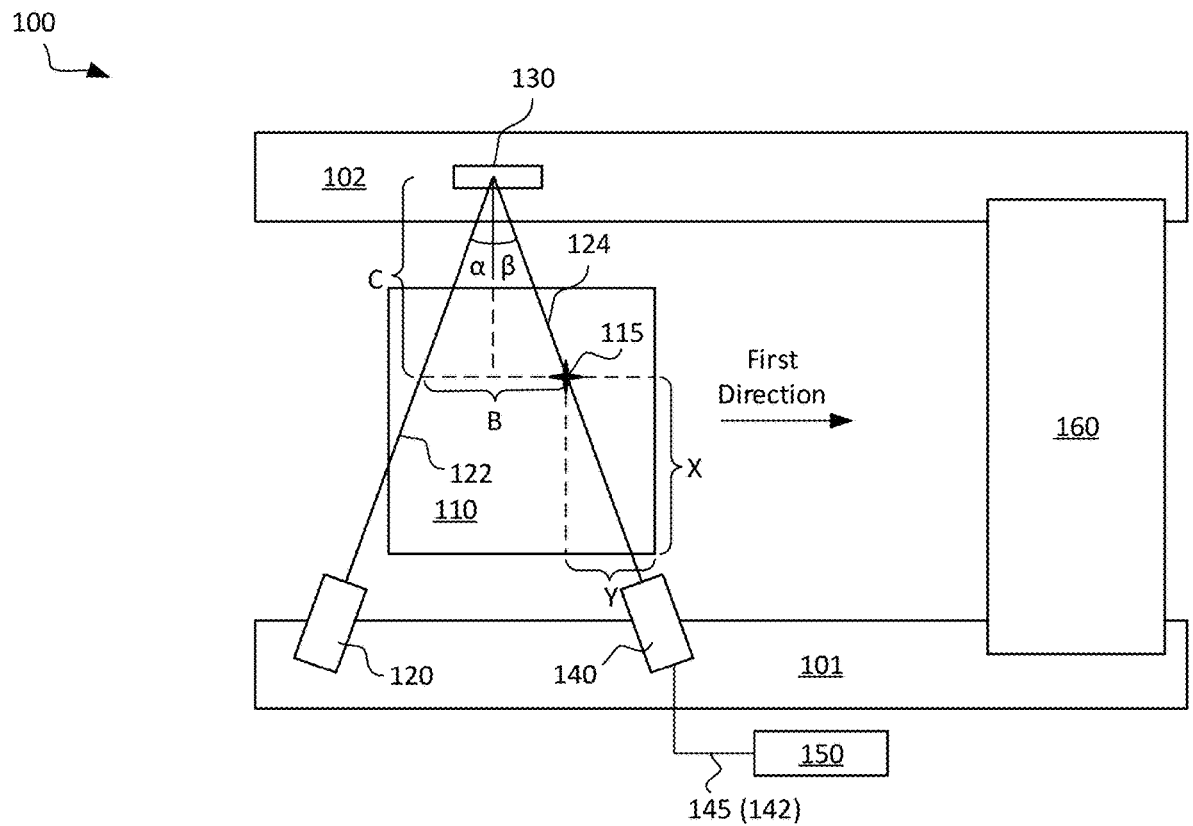
Figure 2F:
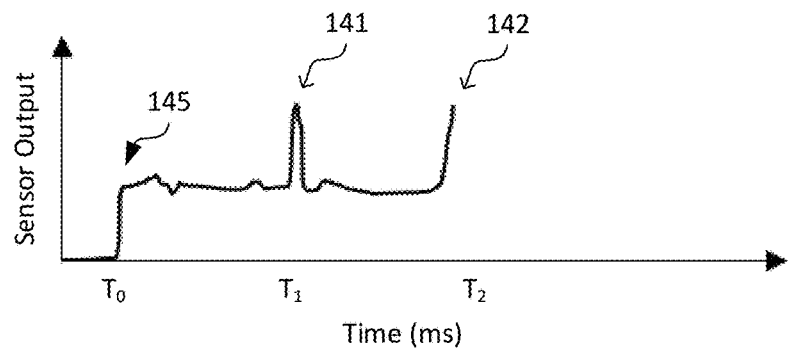

The laser sensor 140 may be further configured to detect a second change in intensity 142 in the laser light 124 received from the laser source 120 redirected by the at least one mirror 130 when the particle 115 on the surface 113 of the modulator 110 passes through the laser light 124 redirected by the at least one mirror 130 (as shown in FIGS. 1F, 2E, and 2F). In other words, when the modulator 110 moves in the first direction, the modulator 110 may further pass through the redirected laser light 124. The particle 115 on the surface 113 of the modulator 110 may cause the second change in intensity 142 in the output signal 145.

The system 100 may further comprise a processor 150. The processor 150 may include a microprocessor, a microcontroller, or other devices.

The processor 150 may be coupled to the components of the system 100 in any suitable manner (e.g., via one or more transmission media, which may include wired and/or wireless transmission media) such that the processor 150 can receive output. The processor 150 may be configured to perform a number of functions using the output. The inspection tool can receive instructions or other information from the processor 150. The processor 150 optionally may be in electronic communication with another inspection tool, a metrology tool, or a review tool (not illustrated) to receive additional information or send instructions.

The processor 150 may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high-speed processing and software, either as a standalone or a networked tool.

The processor 150 may be disposed in or otherwise part of the system 100 or another device. In an example, the processor 150 and may be part of a standalone control unit or in a centralized quality control unit. Multiple processors 150 may be used, defining multiple subsystems of the system 100.

The processor 150 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 150 to implement various methods and functions may be stored in readable storage media, such as a memory.

The processor 150 may be configured according to any of the embodiments described herein. The processor 150 also may be configured to perform other functions or additional steps using the output of the system 100 or using images or data from other sources.

The processor 150 may be communicatively coupled to any of the various components or sub-systems of system 100 in any manner known in the art. Moreover, the processor 150 may be configured to receive and/or acquire data or information from other systems by a transmission medium that may include wired and/or wireless portions. In this manner, the transmission medium may serve as a data link between the processor 150 and other subsystems of the system 100 or systems external to system 100. Various steps, functions, and/or operations of system 100 and the methods disclosed herein are carried out by one or more of the following: electronic circuits, logic gates, multiplexers, programmable logic devices, ASICs, analog or digital controls/switches, microcontrollers, or computing systems. The above description should not be interpreted as a limitation on the present disclosure but merely an illustration The processor 150 may be in communication with the laser sensor 140. For example, the processor 150 may be configured to receive the output signal 145 from the laser sensor 140. Consequently, the processor 150 may receive the first change in intensity 141 and the second change in intensity 142 from the laser sensor 140. The processor 150 may be configured to determine an X-Y location of the particle 115 on the modulator 110 based on the first change in intensity 141 and the second change in intensity 142 according to any of the calculation methods disclosed herein. The X-Y location of the particle 115 may be determined relative to an origin O. The origin O may be defined by a corner of the modulator 110 that first passes through the laser light 122 emitted from the laser source 120 (as shown in FIGS. 1B and 2A). Using the output signal 145 and the speed v, distances of the laser source 120 and the laser sensor 140 from the origin O can be determined. For example, with a speed v of 1 m/s, the distance of the laser source 120 from the origin O may change by 1 mm every 1 ms. Thus, the length of the modulator 110 (in mm) may correspond to a period of time in the output signal 145 (in ms), and a distance of the laser source 120 from the origin O may be determined at each instance in time in the output signal 145. Alternatively, a position encoder may be used to track the location of the modulator 110, such that the position of the modulator 110 can be queried by the processor 150 at times corresponding to the first change in intensity 141 and the second change in intensity to determine the relative distances from the origin O. In this way, the processor 150 may correlate the time and position information from the position encoder with the time and laser power information in the output signal 145 from the laser sensor 140. By further using the first angle $\alpha$ and/or the second angle $\beta$, the X-Y location of the particle 115 may be determined using one of the following methods.

In an embodiment, the X-Y location of the particle 115 may be determined based on a first distance $D_1$ between the laser source 120 and the origin O determined at a time $T_1$ corresponding to the first change in intensity 141 and a second distance $D_2$ between the laser sensor 140 and the origin O determined at a time $T_2$ corresponding to the second change in intensity 142. For example, the sensor output 145 may begin at a time $T_0$ when the laser light 122 is at the origin O. Time $T_1$ is a point in time after time $T_0$. Time $T_2$ is a point in time after the redirected laser light 124 is at the origin O. The first distance $D_1$ and the second distance $D_2$ may be determined by multiplying the speed v by time $T_1$ and time $T_2$, respectively, or may be determined directly from a position encoder. At the time $T_1$, the particle 115 may be found somewhere along a line $L_1$ defined by the laser light 122 from the laser source 120, and at the time $T_2$, the particle may be found somewhere along a line $L_2$ defined by the redirected laser light 124 received by the laser sensor 140. Thus, the X-Y location of the particle 115 may be determined by the intersection of lines $L_1$ and $L_2$. This method is best seen in the configuration of system 100 shown in FIGS. 1A-H, but it may also be applied to the configuration of system 100 in FIGS. 2A-H.

The intersection of lines $L_1$ and $L_2$ may be determined by defining lines $L_1$ and $L_2$ in slope-intercept form: y=mx+b, where m is the slope of the line and b is the y-intercept. Using the first angle α and the second angle β, the slopes of lines $L_1$ and $L_2$ may be equivalent to −tan α and tan β respectively. Depending on the definition of the X and Y directions, the slopes of lines $L_1$ and $L_2$ may be equivalent to tan(90−α) and −tan(90−β), respectively, or other values. Based on the location of the origin O, the y-intercepts of lines $L_1$ and $L_2$ may be equivalent to the first distance $D_1$ and the second distance $D_2$. Thus, lines $L_1$ and $L_2$ may be defined as y=−tan αx+$D_1$ and y=tan βx+$D_2$, respectively. Using these functions, the X-Y location of the particle 115 may be determined algebraically.

In an example, the modulator 110 may have a speed v of 1 m/s, the first angle α may be 20°, the second angle β may be 20°, the time $T_1$ may be 77 ms, and the time $T_2$ may be 15 ms. The first distance $D_1$ may be calculated as 77 mm, and the second distance $D_2$ may be calculated as 15 mm. Thus, lines $L_1$ and $L_2$ may be defined as y=−tan 20x+77 and y=tan 20x+15, respectively. The X-Y location of the particle 115 may be calculated as approximately (86 mm, 46 mm) as follows:

−tan 20x+77=tan 20x+15

−0.36x+77=0.36x+15

0.72x=62 x=86 mm y=tan 20(86)+15 y=46 mm

In another embodiment, the X-Y location of the particle 115 may be determined based on a difference between a time $T_1$ corresponding to the first change in intensity 141 and a time $T_2$ corresponding to the second change in intensity 142. For example, the sensor output 145 may begin at a time $T_0$ when the laser light 122 is at the origin O, and time $T_1$ and time $T_2$ are points in time after time $T_0$. Using the speed v, a distance B traveled by the modulator 110 in the first direction between time $T_1$ and time $T_2$ may be determined. The distance B could also be determined directly from a positon encoder. Using the distance B and known values of a width of the modulator W, a distance A of the mirror 130 from the second side 112 of the modulator, the first angle α, and the second angle β, the X-Y location of the particle 115 may be determined using the following equations:

$$B = (T_2 - T_1)v$$
$$C = \frac{B}{\tan\alpha + \tan\beta}$$
$$x = A + W - C$$
$$y = T_1 v - X \tan\alpha$$

It should be understood that the above equations may differ depending on the definition of the X and Y directions, and may require the use of complements of the first angle α and the second angle β. This method is best seen in the configuration of system 100 shown in FIGS. 2A-H, but it may also be applied to the configuration of system 100 shown in FIGS. 1A-H.

In an example, the modulator 110 may have a width W of 131 mm and speed v of 1 m/s, the mirror 130 may be disposed a distance A 10 mm away from the second side 112 of the modulator 110, the first angle α may be 20°, the second angle β may be 20°, the time $T_1$ may be 77 ms, and the time $T_2$ may be 115 ms. The X-Y location of the particle 115 may be calculated as approximately (86 mm, 46 mm) as follows:

$$B = (T_2 - T_1)v = (117 - 77)(1) = 40\text{ mm}$$
$$C = \frac{B}{\tan\alpha + \tan\beta} = \frac{40}{\tan 20 + \tan 20} = 55\text{ mm}$$
$$x = A + W - C = 10 + 131 - 55 = 86\text{ mm}$$
$$y = T_1 v - X \tan\alpha = (77)(1) - (86)\tan 20 = 46\text{ mm}$$

Referring back to FIGS. 1A and 2A, the system 100 may further comprise an air knife 160. The air knife 160 may be configured to remove the particle 115 from the surface 113 of the modulator 110. For example, air may be ejected from the air knife 160 toward the surface 113 of the modulator 110, so as to remove foreign substances from the surface 113 of the modulator 110. Using the air knife 160, foreign substances may be effectively removed from the surface 113 of the modulator 110 while minimizing damage to the surface 113 of the modulator 110. While air knives 160 are described herein as being used to clean the surface 113 of the modulator 110, other tools capable of removing liquid, solid, and/or gaseous particles from the surface 113 of the modulator 110 may be used (e.g., a wiper, hard brush, soft brush, cloth, etc.).

Figure 1G:
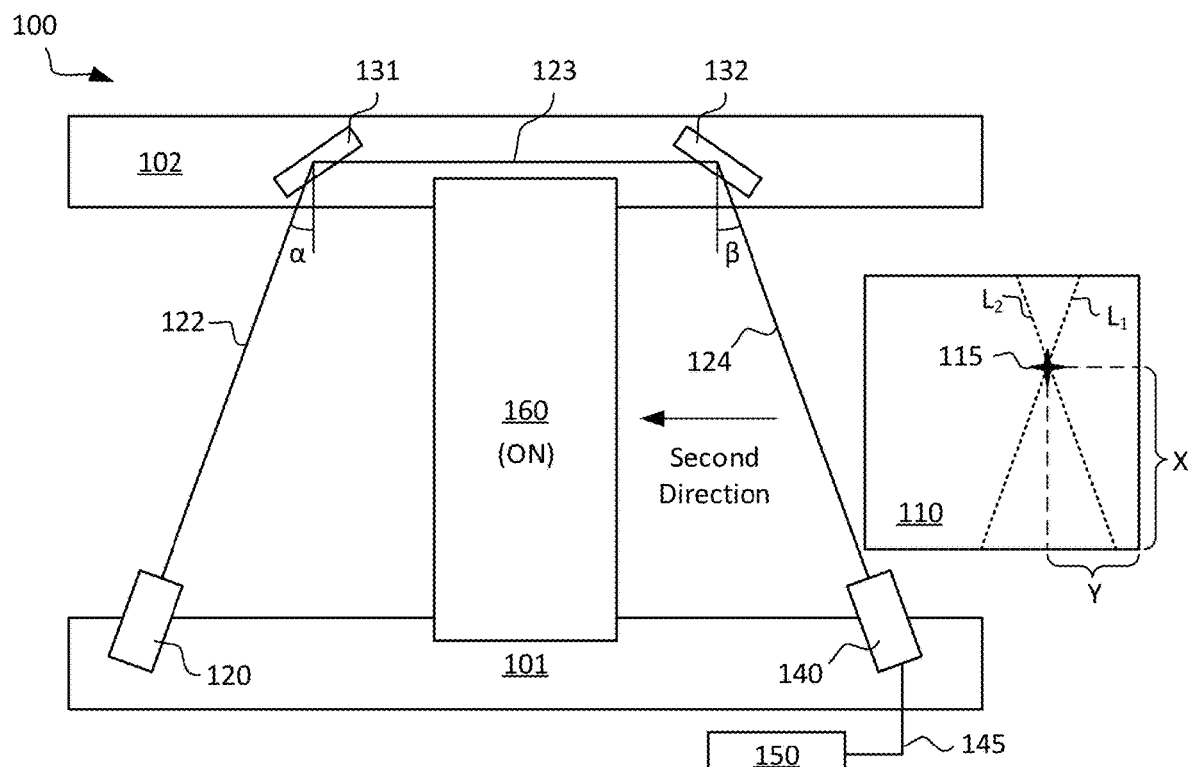
FIGS. 1G-H illustrate the modulator passing in a second direction through the system in the first configuration.
Figure 2G:
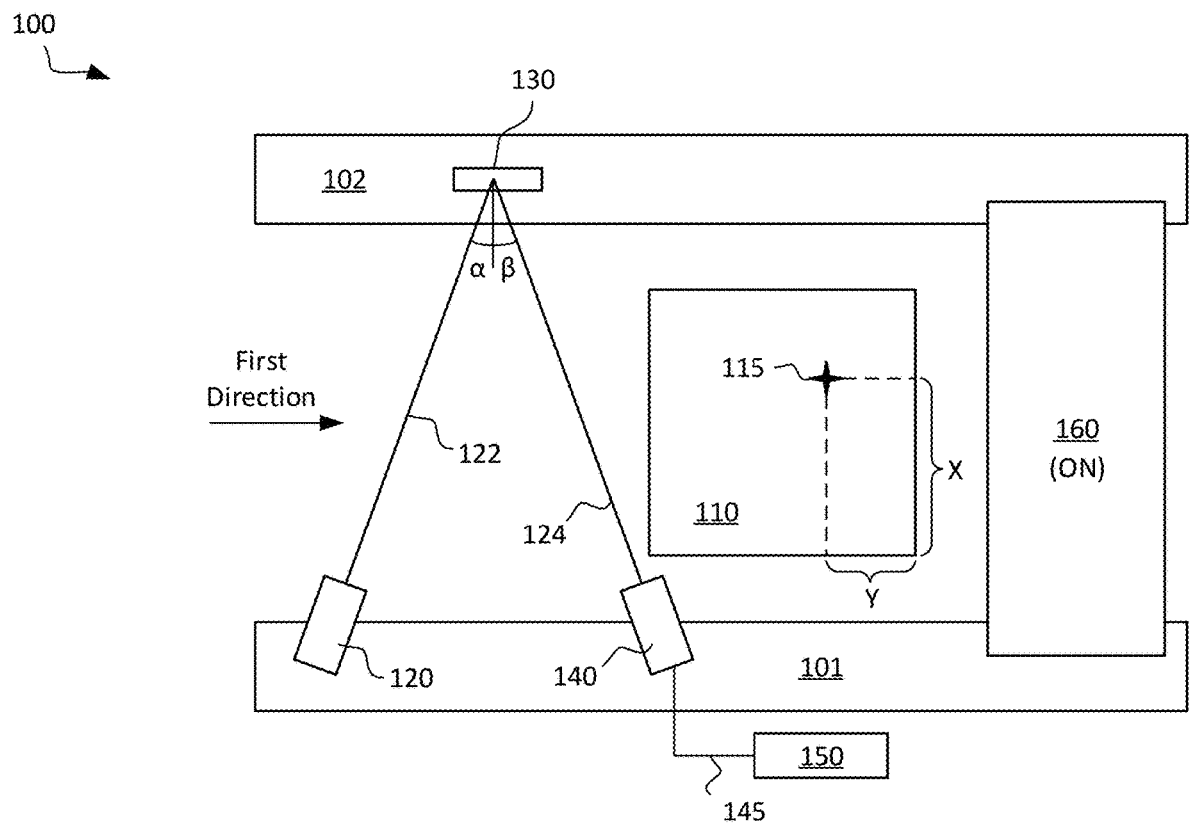
Figure 2H:
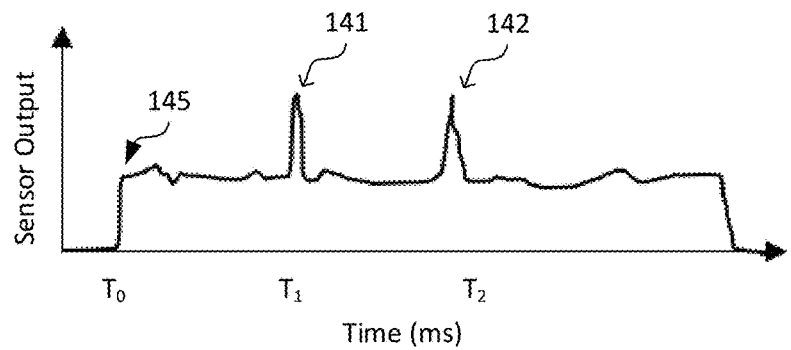

The air knife 160 may be configured to remove the particle 115 from the surface 113 of the modulator 110 after the X-Y location of the particle 115 is determined (i.e., after FIGS. 1G and 2G). In this way, the system 100 can track the X-Y location of the particle to diagnose system-level issues, and/or to confirm that the cleaning process has removed the particle 115 with a second inspection process (i.e., inspect, clean, inspect). Detection of a particle 115 in the second inspection process (i.e., after FIG. 3B) may indicate an issue with the air knife 160 or a defect on the surface 113 of the modulator 110.

The air knife 160 may be disposed on the first support structure 101 and the second support structure 102 of the system 100. For example, the air knife 160 may extend from the first support structure 101 to the second support structure 102. In this way, the modulator 110 may pass beneath the air knife 160 when moving in the first direction between the first support structure 101 and the second structure 102.

Figure 1H:
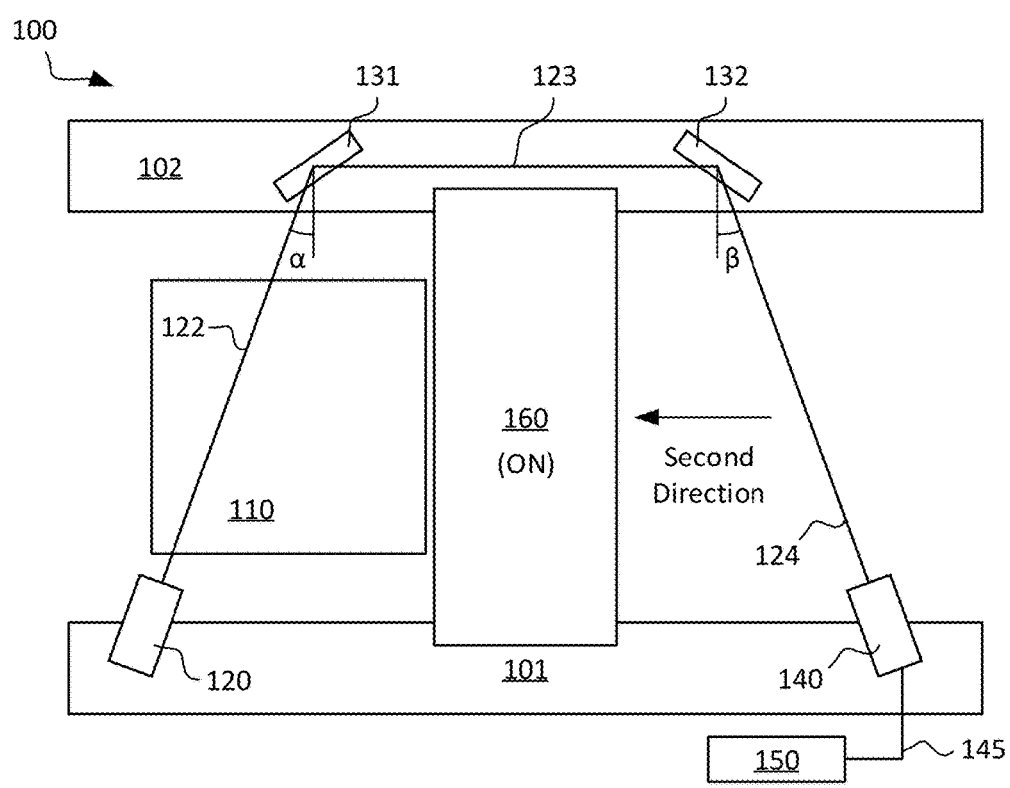

In the embodiment shown in FIGS. 1A-H, the air knife 160 may positioned between the laser source 120 and the laser sensor 140. For example, the air knife 160 may be disposed on the first support structure 101 and the second support structure 102 between the laser source 120 and the laser sensor 140. In this way, the modulator 110 may pass beneath the air knife 160 after passing through the laser light 122 but before passing through the redirected laser light 124, as shown in FIG. 1E. Such a design may reduce space requirements of the system 100 within the overall inspection system. However, in order to avoid removing the particle 115 from the surface 113 of the modulator 110 before determining the X-Y location of the particle 115, the air knife 160 may be set to an OFF state. After determining the X-Y location of the particle 115, the air knife 160 may be set to an ON state to remove the particle 115 from the surface 113 of the modulator 110, as shown in FIGS. 1G and 1H. The modulator 110 may be movable in a second direction, opposite to the first direction, in order to pass beneath the air knife 160 after the X-Y location of the particle 115 is determined.

Figure 3A:
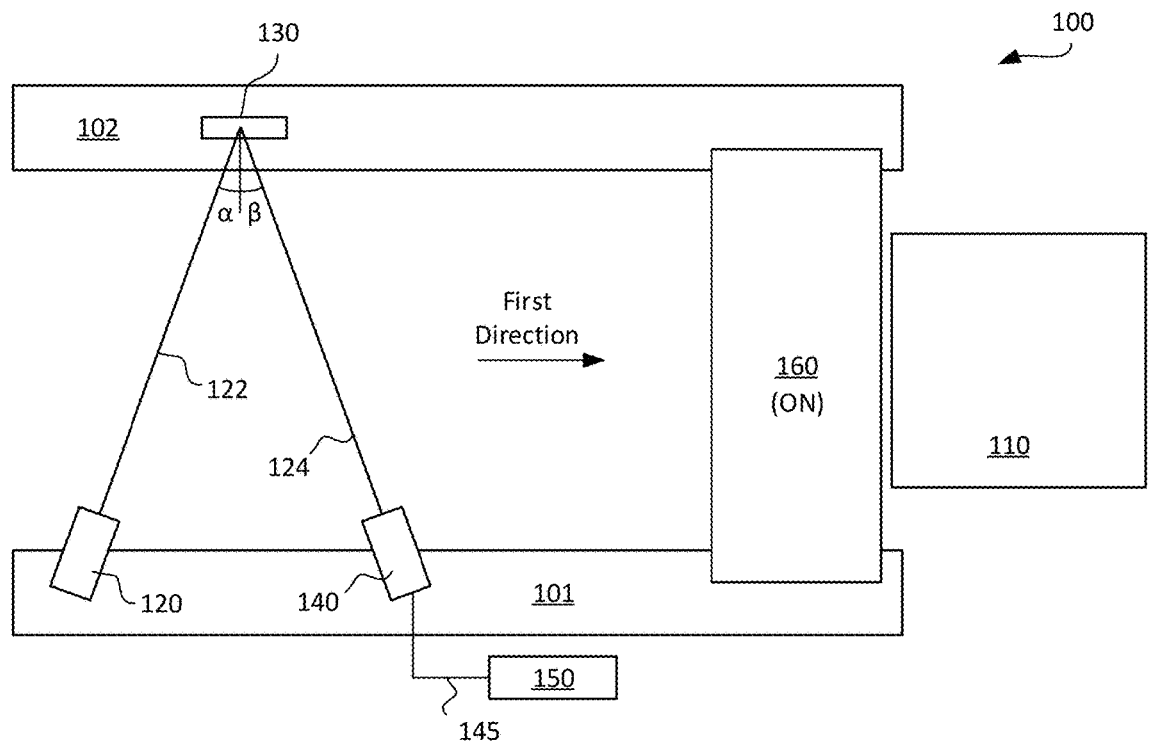
FIGS. 3A-B illustrate the modulator passing in a second direction through the system in the second configuration.
Figure 3B:
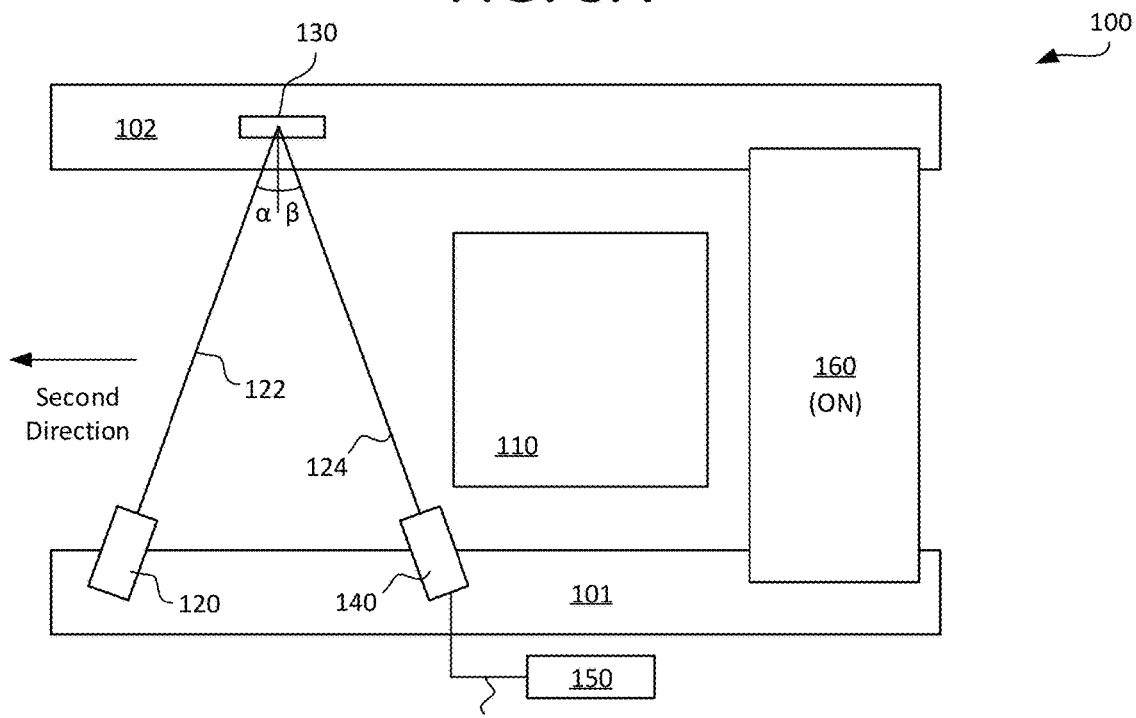

In the embodiment shown in FIGS. 2A-H and 3A-B, the air knife 160 may be positioned downstream from the laser source 120 and the laser sensor 140. For example, the air knife 160 may be disposed on the first support structure 101 and the second support structure 102 downstream from the laser source 120 and the laser sensor 140. In this way, the modulator 110 may pass beneath the air knife 160 after passing through the laser light 122 and the redirected laser light 124, as shown in FIGS. 3A-B. Consequently, the modulator 110 may not pass beneath the air knife 160 before determining the X-Y location of the particle 115, as shown in FIG. 2G. Such a design may not require changing the movement direction of the modulator 110 when performing the cleaning process and/or toggling ON and OFF states of the air knife 160 to prevent removing the particle 115 before determining the X-Y location of the particle 115.

The air knife 160 may be positioned elsewhere in the system 100, based on space requirements. The air knife 160 may also be positioned such that the modulator 110 may be moved directions other than the first direction and/or second direction in order to pass beneath the air knife 160.

With the system 100 of the present disclosure, the X-Y location of the particle 115 on the surface 113 of the modulator 110 may be determined using the output signal 145 of laser light 122 reflected off a mirror 130. By locating the particle 115, the cleaning process can be a closed loop, where feedback is provided to the system 100 to confirm effective cleaning of the modulator 110 and/or diagnose system-level issues.

While the present disclosure is described with reference to a single particle 115 on the surface 113 of the modulator 110, the system 100 may be used in the case of multiple particles 115. For example, after determining the X-Y location of a particle 115 on the surface 113 of the modulator 110 and passing the modulator 110 beneath the air knife 160, the detection process can be performed again. If further particles 115 are detected, the modulator 110 may pass beneath the air knife 160 again, and the detection process may be repeated until the surface 113 of the modulator 110 is confirmed to be free of particles 115. The system 100 may also comprise a plurality of modulators 110, which may individually pass through the laser light 122 for detection of surface particles and pass underneath the air knife 160 for removal of the surface particles. By determining the X-Y location of particles on each of the plurality of modulators 110, system-level issues can be diagnosed where there is a correlation between the locations of the particles on each of the modulators.

Figure 4:
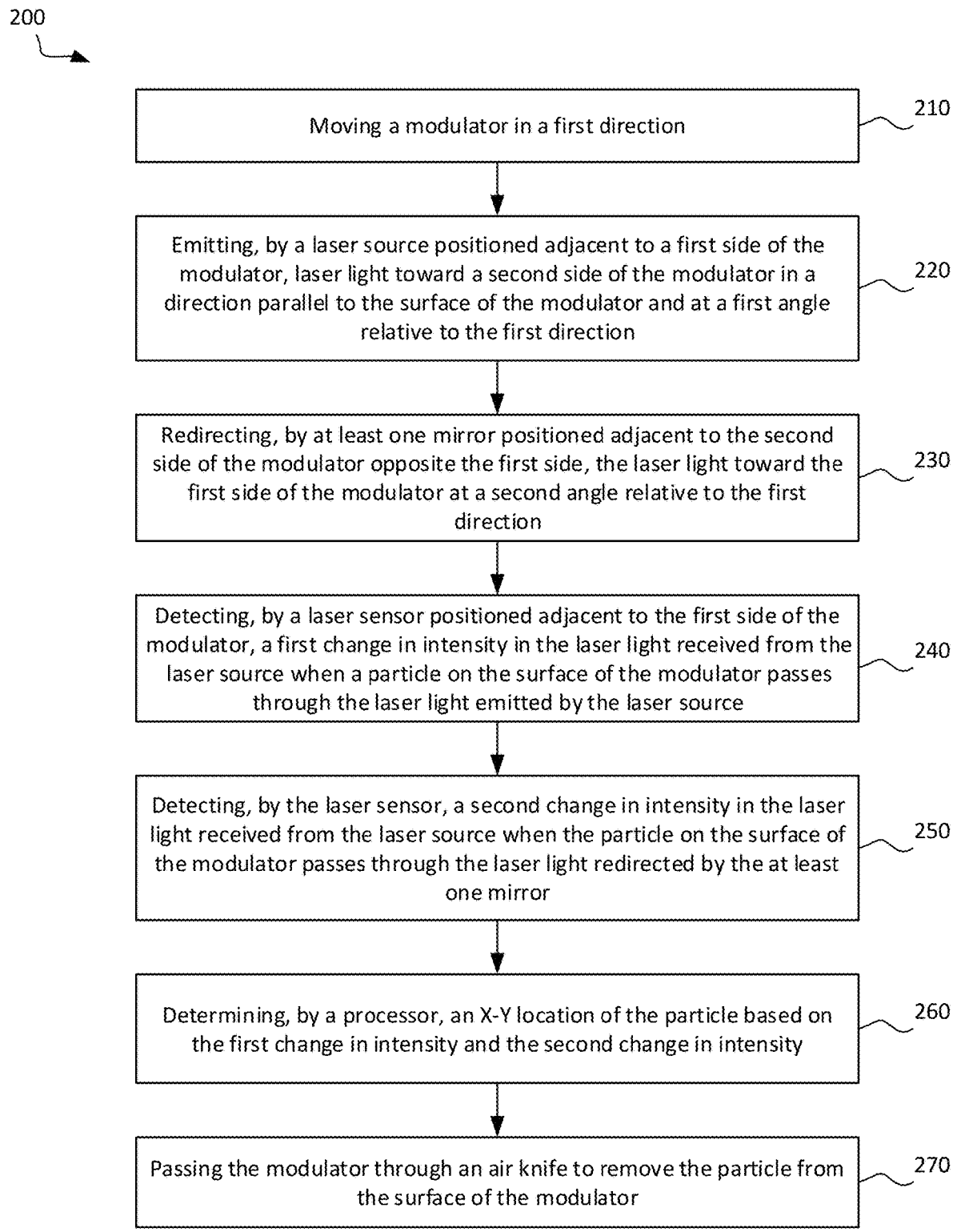
FIG. 4 is a flowchart of a method according to an embodiment of the present disclosure.

Another embodiment of the present disclosure provides a method 200. As shown in FIG. 4, the method 200 may comprise the following steps.

At step 210, a modulator is moved in a first direction. The modulator may be configured to detect defects in electrical circuits. The modulator may be modulator 110 described earlier. The modulator moving in the first direction can be seen sequentially in FIGS. 1A-F, and in FIGS. 2A, 2C, 2E, and 2G.

At step 220, a laser source positioned adjacent to a first side of the modulator emits laser light toward a second side of the modulator in a direction parallel to the surface of the modulator and at a first angle relative to the first direction. The laser light may partially overlap the surface of the modulator.

At step 230, at least one mirror positioned adjacent to the second side of the modulator opposite the first side redirects the laser light toward the first side of the modulator at a second angle relative to the first direction.

At step 240, a laser sensor positioned adjacent to the first side of the modulator detects a first change in intensity in the laser light received from the laser source when a particle on the surface of the modulator passes through the laser light emitted by the laser source. The particle on the surface of the modulator can be seen pass through the laser light emitted by the laser source in FIG. 1C and FIG. 2C.

At step 250, the laser sensor detects a second change in intensity in the laser light received from the laser source when the particle on the surface of the modulator passes through the laser light redirected by the at least one mirror. The particle on the surface of the modulator can be seen pass through the laser light redirected by the at least one mirror in FIG. 1F and FIG. 2E.

At step 260, a processor determines an X-Y location of the particle based on the first change in intensity and the second change in intensity. For example, the processor may receive an output signal from the laser sensor, and may determine the X-Y location of the particle based on times of the first change in intensity and the second change in intensity in the output signal.

Figure 5:
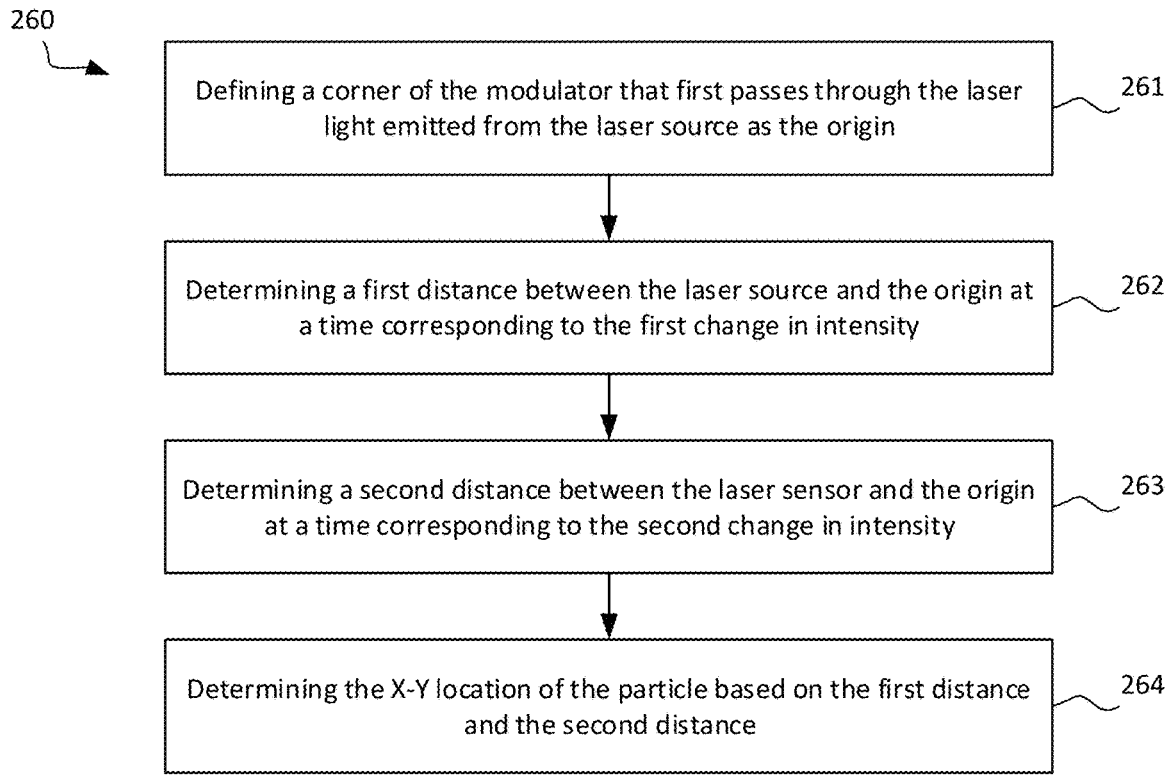
FIG. 5 is a flowchart of a method according to another embodiment of the present disclosure.

According to an embodiment of the present disclosure, step 260 may comprise the following steps (shown in FIG. 5).

At step 261, a corner of the modulator that first passes through the laser light emitted from the laser source is defined as an origin. The X-Y location of the particle may be determined relative to the origin.

At step 262, a first distance between the laser source and the origin is determined at a time corresponding to the first change in intensity. The first distance can be seen in FIG. 1C.

At step 263, a second distance between the laser sensor and the origin is determined at a time corresponding to the second change in intensity. The second distance can be seen in FIG. 1F.

At step 264, the X-Y location of the particle is determined based on the first distance and the second distance. For example, the first distance and the second distance can be used to define two lines that intersect at the X-Y location of the particle. The intersection point can be seen in FIG. 1G. In particular, the first distance and the second distance may be equivalent to the y intercepts of the two lines. The slopes of the two may be determined by the first angle and the second angle of the laser light and redirected laser light. Using the equations of the two lines, the intersection point can be determined algebraically.

Figure 6:
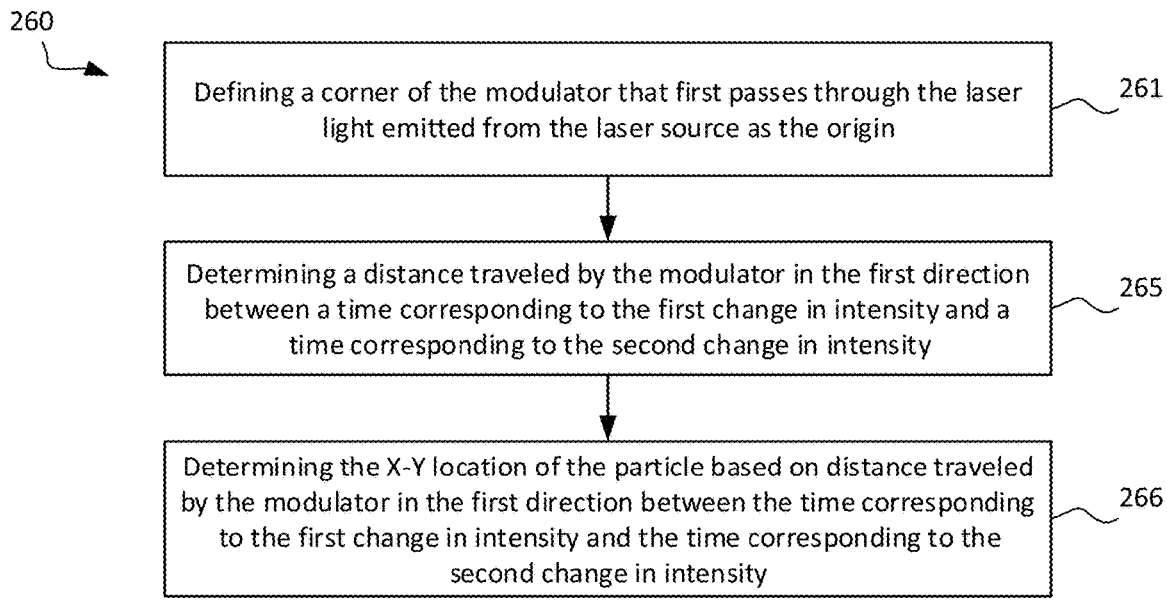
FIG. 6 is a flowchart of a method according to another embodiment of the present disclosure.

According to an embodiment of the present disclosure, step 260 may comprise the following steps (shown in FIG. 6).

At step 261, a corner of the modulator that first passes through the laser light emitted from the laser source is defined as an origin. The X-Y location of the particle may be determined relative to the origin.

At step 265, a distance traveled by the modulator in the first direction between a time corresponding to the first change in intensity and a time corresponding to the second change in intensity is determined. For example, the distance may be determined by multiplying the difference between the time corresponding the first change in intensity and the time corresponding to the second change in intensity by the speed of the modulator.

At step 266, the X-Y location of the particle is determined based on the distance traveled by the modulator in the first direction between the time corresponding to the first change in intensity and the time corresponding to the second change in intensity. For example, the calculated distance and known values of a width of the modulator, a distance of the mirror from the second side of the modulator, the first angle, and the second angle can be used to calculate the X-Y location of the particle. These parameters can be seen in FIGS. 2A and 2E.

According to an embodiment of the present disclosure, the method 200 may further comprise, at step 270, passing the modulator through an air knife to remove the particle from the surface of the modulator. Step 270 may be performed after the X-Y location of the particle is determined at step 260.

In the configuration shown in FIGS. 1A-H, the air knife is positioned between the laser source and the laser sensor. Accordingly, the air knife is configured to be off when moving the modulator in the first direction to avoid removing the particle before the X-Y location of the particle is determined. Thus, the method 200 may further comprise, moving the modulator in a second direction, the second direction being opposite to the first direction. This can be seen in FIGS. 1G and 1H. The air knife is configured to be on when moving the modulator in the second direction in order to remove the particle from the surface of the modulator after determining the X-Y location of the particle.

In the configuration shown in FIGS. 2A-H, the air knife is positioned downstream from the laser source and the laser sensor. Accordingly, the air knife may be configured to be on when moving the modulator in the first direction to remove the particle from the surface of the modulator, as shown in FIG. 3A. After determining the X-Y location of the particle and removing the particle from the surface of the modulator, the method 200 may further comprise moving the modulator in a second direction. This can be seen in FIG. 3B. By moving the modulator in the second direction, the modulator may pass through the laser light again. This may be used to confirm that the particle was removed from the surface of the modulator by the air knife, or to diagnose system-level problems.

With the method 200 of the present disclosure, the X-Y location of the particle on the surface of the modulator may be determined using the output signal of laser light reflected off a mirror. By locating the particle, the cleaning process can be a closed loop, where feedback is provided to the system to confirm effective cleaning of the modulator and/or diagnose system-level issues.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A system comprising:
   a modulator configured to detect defects in electrical circuits, the modulator being movable in a first direction;
   a laser source positioned adjacent to a first side of the modulator, the laser source being configured to emit laser light toward a second side of the modulator in a direction parallel to the surface of the modulator and at a first angle relative to the first direction, and the laser light partially overlaps the surface of the modulator;
   at least one mirror positioned adjacent to the second side of the modulator opposite the first side, and the at least one mirror being configured to redirect the laser light toward the first side of the modulator at a second angle relative to the first direction;
   a laser sensor positioned adjacent to the first side of the modulator, the laser sensor being configured to:
   detect a first change in intensity of the laser light received from the laser source when a particle on the surface of the modulator passes through the laser light emitted by the laser source; and
   detect a second change in intensity in the laser light received from the laser source redirected by the at least one mirror when the particle on the surface of the modulator passes through the laser light redirected by the at least one mirror; and
   a processor configured to determine an X-Y location of the particle based on the first change in intensity and the second change in intensity.

2. The system of claim 1, further comprising an air knife configured to remove the particle from the surface of the modulator after the X-Y location of the particle is determined.

3. The system of claim 2, wherein the air knife is positioned between the laser source and the laser sensor.

4. The system of claim 2, wherein the air knife is positioned downstream from the laser source and the laser sensor.

5. The system of claim 1, wherein the first angle and the second angle are between 0 degrees and 90 degrees.

6. The system of claim 1, wherein the at least one mirror comprises a pair of mirrors positioned at symmetrical angles relative to the first direction.

7. The system of claim 1, wherein the at least one mirror comprises one mirror positioned parallel to the first direction.

8. The system of claim 1, wherein the X-Y location of the particle is determined relative to an origin defined by a corner of the modulator that first passes through the laser light emitted from the laser source.

9. The system of claim 8, wherein the X-Y location of the particle is determined based on a first distance between the laser source and the origin determined at a time corresponding to the first change in intensity and a second distance between the laser sensor and the origin determined at a time corresponding to the second change in intensity.

10. The system of claim 8, wherein the X-Y location of the particle is determined based on a difference between a time corresponding to the first change in intensity and a time corresponding to the second change in intensity.

11. The system of claim 1, wherein the X-Y location of the particle is determined based on the first angle and/or the second angle.

12. The system of claim 1, wherein the modulator is movable at a constant speed.

13. A method comprising:
   moving a modulator in a first direction, the modulator being configured to detect defects in electrical circuits;
   emitting, by a laser source positioned adjacent to a first side of the modulator, laser light toward a second side of the modulator in a direction parallel to the surface of the modulator and at a first angle relative to the first direction, and the laser light partially overlaps the surface of the modulator;

redirecting, by at least one mirror positioned adjacent to the second side of the modulator opposite the first side, the laser light toward the first side of the modulator at a second angle relative to the first direction;

detecting, by a laser sensor positioned adjacent to the first side of the modulator, a first change in intensity in the laser light received from the laser source when a particle on the surface of the modulator passes through the laser light emitted by the laser source;

detecting, by the laser sensor, a second change in intensity in the laser light received from the laser source redirected by the at least one mirror when the particle on the surface of the modulator passes through the laser light redirected by the at least one mirror; and determining, by a processor, an X-Y location of the particle based on the first change in intensity and the second change in intensity.

14. The method of claim 13, further comprising passing the modulator through an air knife to remove the particle from the surface of the modulator.

15. The method of claim 14, wherein the air knife is positioned between the laser source and the laser sensor, and the air knife is configured to be off when moving the modulator in the first direction.

16. The method of claim 15, further comprising moving the modulator in a second direction, the second direction being opposite to the first direction, wherein the air knife is configured to be on when moving the modulator in the second direction.

17. The method of claim 14, wherein the air knife is positioned downstream from the laser source and the laser sensor, and the air knife is configured to be on when moving the modulator in the first direction.

18. The method of claim 13, further comprising defining a corner of the modulator that first passes through the laser light emitted from the laser source as an origin, wherein the X-Y location of the particle is determined relative to the origin.

19. The method of claim 18, wherein determining, by the processor, the X-Y location of the particle based on the first change in intensity and the second change in intensity comprises:

determining a first distance between the laser source and the origin at a time corresponding to the first change in intensity;

determining a second distance between the laser sensor and the origin at a time corresponding to the second change in intensity; and determining the X-Y location of the particle based on the first distance and the second distance.

20. The method of claim 18, wherein determining, by the processor, the X-Y location of the particle based on the first change in intensity and the second change in intensity comprises:

determining a distance traveled by the modulator in the first direction between a time corresponding to the first change in intensity and a time corresponding to the second change in intensity; and determining the X-Y location of the particle based on the distance traveled by the modulator in the first direction between the time corresponding to the first change in intensity and the time corresponding to the second change in intensity.

\* \* \* \* \*